United States Patent
Li

(10) Patent No.: US 9,979,649 B2
(45) Date of Patent: May 22, 2018

(54) HIGH DENSITY CONTENT ADDRESSABLE MEMORY

(71) Applicant: Wisconsin Alumni Research Foundation, Madison, WI (US)

(72) Inventor: Jing Li, Madison, WI (US)

(73) Assignee: Wisconsin Alumin Research Foundation, Madison, WI (US)

( * ) Notice: Subject to any disclaimer, the term of this patent is extended or adjusted under 35 U.S.C. 154(b) by 229 days.

(21) Appl. No.: 14/959,614

(22) Filed: Dec. 4, 2015

(65) Prior Publication Data

US 2017/0163534 A1 Jun. 8, 2017

(51) Int. Cl.
*G11C 8/10* (2006.01)
*H04L 12/743* (2013.01)
*G06F 13/28* (2006.01)
*G06F 13/16* (2006.01)

(52) U.S. Cl.
CPC ...... *H04L 45/7457* (2013.01); *G06F 13/1636* (2013.01); *G06F 13/287* (2013.01); *G11C 8/10* (2013.01)

(58) Field of Classification Search
CPC .................................. G11C 8/10; G11C 15/04
USPC ............................................ 365/49.1, 230.06
See application file for complete search history.

(56) References Cited

U.S. PATENT DOCUMENTS

| | | | | |
|---|---|---|---|---|
| 4,811,302 A * | 3/1989 | Koishi | .................. | G11C 7/065 365/205 |
| 5,125,098 A * | 6/1992 | Burrows | ................. | G11C 8/00 711/108 |
| 5,220,526 A * | 6/1993 | Giles | ...................... | G11C 15/00 365/49.1 |
| 5,428,565 A * | 6/1995 | Shaw | ..................... | G11C 15/04 365/189.04 |
| 6,046,923 A * | 4/2000 | Evans | .................... | G11C 15/00 365/230.02 |
| 6,199,140 B1 * | 3/2001 | Srinivasan | ............. | G11C 15/00 365/49.17 |
| 6,323,680 B1 * | 11/2001 | Pedersen | ............ | H03K 19/1737 326/38 |
| 6,381,673 B1 * | 4/2002 | Srinivasan | ............. | G11C 15/00 365/49.18 |
| 7,092,311 B1 * | 8/2006 | Proebsting | ............. | G11C 15/00 365/230.03 |
| 7,257,084 B1 * | 8/2007 | Srinivasan | ............. | H04L 45/00 370/235 |

(Continued)

OTHER PUBLICATIONS

Jing Li et al.; "1Mb 0.41 $\mu m^2$ 2T-2R Cell Nonvolatile TCAM With Two-Bit Encoding and Clocked Self-Referenced Sensing." Solid State Circuits, IEEE Journal of 49. No. 4 (Apr. 2014): pp. 896-907. USA.

*Primary Examiner* — Michael Tran
(74) *Attorney, Agent, or Firm* — Boyle Fredrickson, S.C.

(57) ABSTRACT

An associative memory that can be integrated with standard computer memory flexibly reduces its parallelism to match the memory bus speed thereby providing substantial increases in memory density possible by a multiplexing of sense amplifiers that otherwise dominate the memory structure. Apparent parallel operation is provided by an accumulator that reassembles the multiplex data. Higher memory density makes dual use of the associative memory as a content addressable memory and random-access memory possible.

16 Claims, 5 Drawing Sheets

(56) References Cited

U.S. PATENT DOCUMENTS

| | | | |
|---|---|---|---|
| 7,298,640 B2 * | 11/2007 | Chen ................... | G11C 11/16 257/E27.004 |
| 2003/0227801 A1 * | 12/2003 | Battaglia ............. | G06F 12/0893 365/200 |
| 2004/0049629 A1 * | 3/2004 | Miura ................. | G06F 11/1068 711/105 |
| 2005/0105326 A1 * | 5/2005 | Hanzawa ................ | G11C 7/14 365/154 |
| 2006/0098478 A1 * | 5/2006 | Ezaki .................... | B82Y 10/00 365/158 |
| 2007/0064467 A1 * | 3/2007 | Jacquet ................... | G11C 7/18 365/104 |
| 2008/0089327 A1 * | 4/2008 | Lu ....................... | H04L 45/7453 370/389 |
| 2009/0003047 A1 * | 1/2009 | Toda ..................... | G11C 13/00 365/163 |
| 2010/0014341 A1 * | 1/2010 | Takashima ............. | G11C 11/22 365/145 |
| 2013/0208523 A1 * | 8/2013 | Alvarez-Herault .. | G11C 15/046 365/50 |
| 2013/0223121 A1 * | 8/2013 | Chang ................... | G11C 15/00 365/49.15 |
| 2013/0326111 A1 * | 12/2013 | Arsovski ................ | G11C 15/04 711/102 |
| 2014/0003160 A1 * | 1/2014 | Trivedi ................... | G11C 7/12 365/189.02 |
| 2014/0032812 A1 * | 1/2014 | Ong ....................... | G11C 7/222 711/102 |
| 2015/0117109 A1 * | 4/2015 | La Rosa ............ | G11C 16/0425 365/185.18 |

* cited by examiner

HIGH DENSITY CONTENT ADDRESSABLE MEMORY

STATEMENT REGARDING FEDERALLY SPONSORED RESEARCH OR DEVELOPMENT

--

CROSS REFERENCE TO RELATED APPLICATION

--

BACKGROUND OF THE INVENTION

The present invention relates to an improved architecture for associative memories used for in-memory analytics and the like and in particular to an architecture providing greater memory densities in integrated circuits.

A common computational task for an electronic computer is that of searching for a particular value in memory. For example, in routing packets over a network, it may be necessary to search for a packet address in memory in order to route the packet through a correct port.

Conventional random access memory operates by receiving an address designating a memory location and providing access to the data stored at that received address, for example, reading that data or modifying that data. In searching operations, random-access memories typically must access multiple memory addresses in series before a determination may be reached as to whether the data exists and its location. The time required to complete each sequential memory access can slow the searching operation.

Associative memories provide a faster way of searching for data. Such memories may receive the value of the data being searched for (a search pattern) and simultaneously review all memory addresses for that pattern. The associative memory typically returns a list of storage addresses holding data that matches the search pattern and these addresses may serve as a link to other needed data. A specialized processor (for example, a network processor) working with an associative memory can perform searches far in excess of the speeds obtainable with conventional random-access memory.

One form of associative memory is a (binary) content addressable memory (CAM) which stores binary values that can be compared to the binary search patterns. One drawback to such CAMs occurs when it is desired to search for a range, for example, a range of search pattern addresses between the upper and lower values. In such cases, each search pattern within the range of patterns must be stored in the CAM using valuable CAM memory space.

To address this drawback, ternary content addressable memories (TCAM) have been developed which store the binary values of 0 and 1 and also a "don't care" value (typically denoted X) indicating a special value that matches to either a 0 or 1 in the search pattern. With this additional don't care state, a range of search patterns, for example, 10000 to 10011 can be saved in a single TCAM memory location, for example, as 100XX.

Memories, including random access memories, CAMs and TCAMs, employ sense amplifiers which receive electrical signals from the transistor storage cells of each memory address and interpret those signals into binary (or don't care) values. In a conventional random access memory, sense amplifiers can be shared between different memory addresses because only one address will be accessed at a time. The sharing can be implemented, for example, by means of a multiplexer switching the sense amplifier between portions of the memory according to a portion of the memory address used to access the memory.

In contrast, associative memory is intended to operate in parallel over all memory addresses and accordingly separate sense amplifiers must be provided for each memory address to permit parallel searching of the entire memory range.

The sense amplifiers can consume a substantial area in an associative memory, and in fact a majority of the area of the associative memory circuit is normally occupied by sense amplifiers. The result is that associative memories are relatively expensive on a per bit basis when compared to conventional random access memory. The expense of associative memory substantially limits its use.

SUMMARY OF THE INVENTION

An increasingly important application of associative memories occurs not in specialized search appliances, such as routers, but in more conventional computer architectures where the associative memories are used for "in-memory processing" or the like. In-memory processing executes computer processes normally performed by a general purpose processing unit (CPU) directly in memory. In-memory processing eliminates the delay associated with transferring data from the memory to the processor and then back again. In such applications, associative memory may be integrated with standard random-access memory on a common memory bus.

When an associative memory is used with a standard memory bus, the speed at which the associative memory can return results may be far in excess of the speed at which the results can be transferred over the memory bus. The present inventor has recognized that in this situation an associative memory can be constructed that trades off execution speed for other benefits such as increased memory density. This latter benefit can be obtained by multiplexing a reduced number of sense amplifiers between associative memory sections. Internally, each memory section may execute in parallel, but between sections the sections are constrained to execute serially. The result is an associative memory that can flexibly trade lower speed against higher density (and effectively lower cost).

Ideally, this trade-off reduces the performance of the associative memory to exactly match the bus speed thereby maximizing the reduction in associative memory cost.

Specifically then, the present invention provides an associative memory having a set of memory cells arranged in logical rows and columns and adapted to receive an input pattern in parallel along the rows and to provide an output indication along each column reflecting whether stored values of memory cells of each column match the input pattern. An input decoder applies an input pattern applied simultaneously to the logical rows of the set of memory cells and a set of multiplexers to receive at multiplexer inputs, outputs from multiple columns of the set of memory cells. The multiplexers also receive a selector input controlling a connection of one of the multiplexer inputs to a multiplexer output. Sense amplifiers communicate with each of the multiplexer outputs for interpreting the multiplexer outputs as logical values at the sense amplifier outputs.

It is thus a feature of at least one embodiment of the invention to provide a "piecewise" parallel associative memory that can permit some sense amplifier multiplexing for improved memory density at the expense of execution speed.

The associative memory may further include a sequencer providing a selector input to each multiplexer operating to connect the multiplexer inputs successively to the multiplexer output in a cycle while a given input pattern is being applied to the rows.

It is thus a feature of at least one embodiment of the invention to provide essentially the same output as provided by a conventional associative memory by sequentially accessing the piece-wise parallel portions of the associative memory.

The memory may receive, at a bus timing signal input, a periodic timing signal from a memory bus communicating with the associative memory, the timing signal providing a timing of transfer of data on the memory bus to the associative memory, and the sequencer may operate synchronously with the bus timing signal to complete a cycle of connecting the sequence of multiplexer inputs successively to the multiplexer output within a period of the timing signal.

It is thus a feature of at least one embodiment of the invention to permit matching the operating speed of the associative memory to the timing speed of an associative memory box to attain the benefits of greater density without substantially slowing the operation of an associated computer system such as will be memory bus limited.

The time duration of the cycle is substantially equal to the period of the timing signal.

It is thus a feature of at least one embodiment of the invention to maximize the memory density benefits to be obtained from the present invention for a given computer system.

The associative memory may further include an accumulator communicating with the sense amplifier outputs to receive logical values at different selector inputs at different accumulator storage elements to construct a data word representing the output of each column.

It is thus a feature of at least one embodiment of the invention to provide an associative memory that appears substantially identical to conventional associative memory and provides an output word that comprehensively reflects the search of the entire associative memory space.

The output of each column may be a logical combination of matchings at each given memory cell of the column between a portion of the input pattern received by the given memory cell and a value stored in the given memory cell.

It is thus a feature of at least one embodiment of the invention to provide a system that is compatible with the column logic used with standard associative memories.

Each memory cell may store a logical one or a logical zero value that matches a portion of the input pattern on an associated row if that portion is identical to the stored value. The memory cell may also store a logical don't care value always matching the portion of the input pattern on the associated row.

It is thus a feature of at least one embodiment of the invention to provide a ternary content addressable memory with substantially greater density and lower cost for use within memory processing systems.

The memory cells employ a resistance element having a resistive value-storing data.

It is thus a feature of at least one embodiment of the invention to greatly leverage the benefits of the present invention in resistance type memory cells that employ extremely low numbers of transistors and thus have the potential for the greatest density increases from the present invention.

The input decoder may receive a search word and decode the search word to the input pattern different from the search word according to a predetermined function.

It is thus a feature of at least one embodiment of the invention to permit input pattern translation, for example, to provide "two-bit" memory architectures of the type developed by the present inventor which can further increase the density of the memory system.

The input decoder may operates in a first pass-through mode to apply the data simultaneously to the logical rows of the set of memory cells and in a second address decoder mode to select a single of the logical rows of the set of memory cells for access. The input decoder operating in the second address decoder mode may either write or read the data of the selected single row.

It is thus a feature of at least one embodiment of the invention to provide an associative memory that can switch between operating modes to also operate like a random-access memory. By greatly increasing the density of the associative memory using the present invention, the present invention may practically serve to augment random-access memory when associative memory properties are not required.

More specifically, the present invention provides a computer system having an electronic processor for executing arithmetic and logical instructions on data and an electronic memory system including both (1) random access memory receiving memory addresses to provide access to data stored at the addresses and (2) content addressable memory receiving search words to provide data indicating whether the search words match data stored in the content addressable memory. The memory system may make use of a unified memory bus communicating between the random access memory and the content addressable memory to provide memory addresses to the random access memory and search words to the content addressable memory and to receive data in response.

It is thus a feature of at least one embodiment of the invention to provide a general purpose computer architecture that can perform in-memory processing using large low-cost associative memories possible with the present invention.

The random-access memory may be a dynamic random access memory and the memory bus may provide data and control lines for communicating with dynamic random access memory and the content addressable memory may be compatible with the data and control signals of the memory bus.

It is thus a feature of at least one embodiment of the invention to provide an associative memory that is compatible with standard DRAM memory bus timings and protocols.

These particular objects and advantages may apply to only some embodiments falling within the claims and thus do not define the scope of the invention.

DETAILED DESCRIPTION OF THE PREFERRED EMBODIMENT

Figure 1:
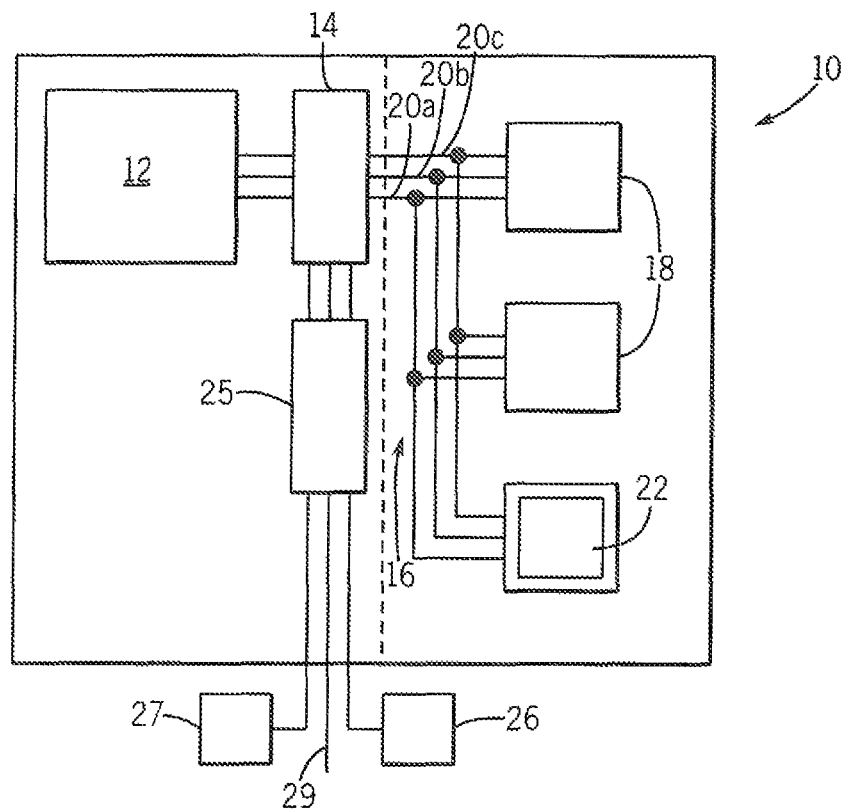
FIG. 1 is a block diagram of a computer providing integrated associative memory and random-access memory per the present invention.

Referring now to FIG. 1, an electronic computer system 10 according to the teachings of the present invention may provide for a processor unit 12, for example, comprising one or more single or multicore electronic computer processors. The processor units 12 may be general-purpose processors executing a variety of arithmetic and logical instructions for general-purpose computational problems.

The processor unit 12 may communicate through a first buffer chip 14 with a memory bus 16 of conventional design for interfacing with random-access memory. In this regard, the memory bus may connect with one or more random access memories (RAM) 18, such as dynamic random access memory of the type well known the art, to allow for reading data from the RAM 18 or writing data to the RAM 18. In one embodiment, the memory bus 16 may include data lines 20a for sending or receiving data to or from the RAM 18, address lines 20b describing the address of the RAM 18 which will be accessed during the reading or writing of data, and control lines 20c providing chip selection, operating mode, and timing signals for coordinating the reading and writing of the RAM 18 as is generally understood in the art. The control lines 20c may further provide for a. RAM/CAM mode signal 21 as will be described below The memory bus 16 may also communicate with an associative memory 22, as will be discussed in greater detail below, that is compatible with the memory bus 16. As noted, the RAM 18 will generally receive address data over address lines 20b and provide for either reading or writing of data from or to the addresses of the RAM 18 indicated by the address data. In contrast, the associative memory 22, in a search mode selected by RAM/CAM mode signal 21, will receive a search word, for example, over data lines 20a and will return over data lines 20a an indication of whether the search word is found in the associative memory 22 by providing an indication of one or more addresses at which the data is found. Generally this data will be provided in conformance with the control signals of control lines 20c and the address lines 20b may be ignored; however, it will be understood that the address lines may equally be used for communicating the search word as an architectural choice. In a second mode, the associative memory 22 acts like a standard DRAM memory as far as addressing the memory cells of the associative memory 22. This mode has two sub modes, one allowing individual addresses provided by the address lines 20b for addresses of the associative memory 22 to be accessed for writing or programming memory cells of the associative memory 22 and the other allowing individual addresses provided by the address lines 20b to be used for reading of the memory cells of the associative memory in the manner of a standard random-access memory.

The electronic computer system 10 may otherwise be similar to standard computer architectures, for example, in one possible architecture including a bridge 25 communicating with the first buffer chip 14 and providing electrical interconnection to human machine interface elements 27 such as a keyboard, display, mouse, etc. as well as mass storage devices 26, for example, disk drives and other serial and parallel interfaces 29 including, for example, network connections to the Internet or the like.

Figure 2:
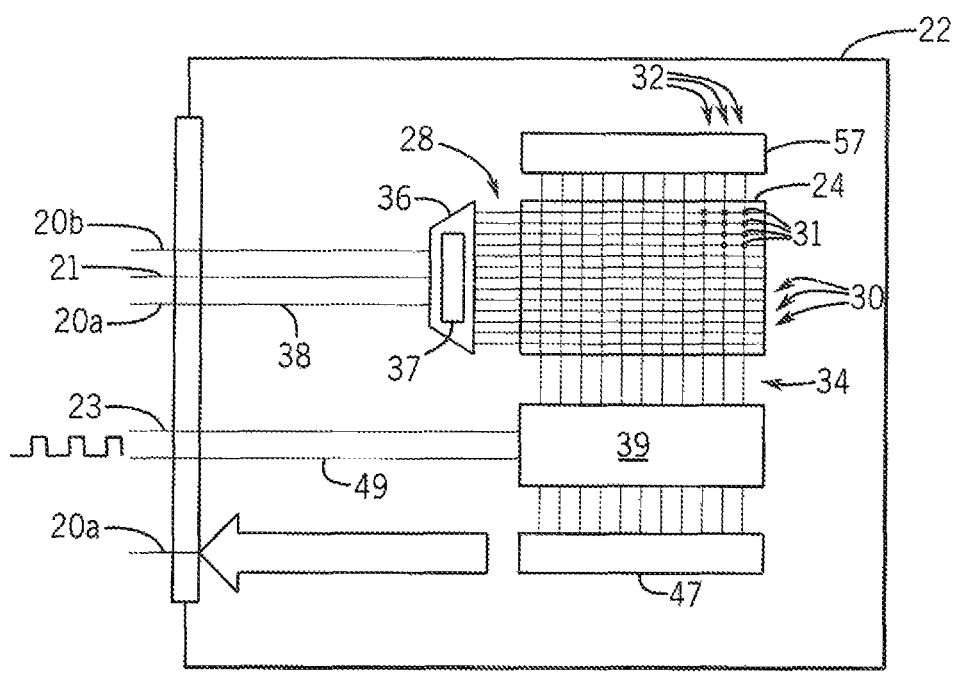
FIG. 2 is an expanded diagram of the associative memory of FIG. 1 showing a sense amplifier multiplexing circuit.

Referring now to FIG. 2, the associative memory 22 may include a memory array 24 holding data of the associative memory 22 and comprised of many memory cells 31 arranged in logical rows 30 and columns 32. In a content addressable mode, the memory array 24 may receive an input pattern 28 (of logical ones and zeros) in parallel at multiple logical rows 30, each logical row 30 spanning multiple logical columns 32. Here, the columns represent data words of the memory whose bits are held in memory cells 31 and whose rows represent the positions of bits within those data words. The input pattern 28 is applied simultaneously along the rows 30 to all of the memory cells 31 which may receive those inputs and provide outputs of the memory cells 31 that may be acquired along the columns 32 providing output signals 34 indicating whether the data held in the memory cells 31 of the column 32 match the input pattern 28 as will be discussed below. The output signals 34 pass downward through all of the columns in parallel to provide extremely fast interrogation of each of the memory cells 31 in the memory array 24.

In the content addressable mode, the input pattern 28 received from a row decoder 36 may be identical to the input word 38 from the processor unit 12 along data lines 20a and provides a search word. This transfer process may be performed by an input decoder 37 operating in a first pass-through mode to simply pass data through from input lines, holding the input word 38 to output lines holding the input pattern 28. Alternatively, in this pass-through mode, the input decoder 37 may slightly modify the input pattern 28 from that of the input word 38 received from the processor unit 12 to improve the data density of the associative memory 22. For example, input decoder 37 may remap the input word 38 to input pattern 28 that provides "two-bit encoding" as described generally in: 1 Mb 0.41 μm2 2T-2R Cell Nonvolatile TCAM With Two-Bit Encoding and Clocked Self-Referenced Sensing, by Jing Li, Robert K. Montoye, Masatoshi Ishii, Leland Chang, IEEE Journal of Solid-State Circuits, volume 49, number 4, April 2014 04/2014; DOI: 10.1109/JSSC.2013.2292055 hereby incorporated in its entirety by reference. This technique generally takes advantage of the extra storage capacity of each TCAM cell to store four memory states when only three memory states (e.g., 0, 1, and don't care) are used.

As will be discussed below, the row decoder 36 may also operate in an address decoder mode, where the input word 38 is interpreted as address data from address lines 20b. Here the input word 38 is evaluated as a binary number having a range equal to the number of logical rows 30 and an input pattern 28 is provided that activates only a single row 30 when the associative memory 22 is used in a random access mode as discussed further below.

Referring still to FIG. 2, in the content addressable mode, the output signals 34 are received by a sense amplifier bank 39 which provides a substantial reduction in the amount of integrated circuit area needed for sense amplification. The sense amplifier bank 39 will be discussed below. The output of the sense amplifier bank 39 is provided to a register (also termed herein an accumulator 47) that buffers data from the sense amplifier bank 39 to be output along data lines 20a providing search results to the processor unit 12.

Figure 3:
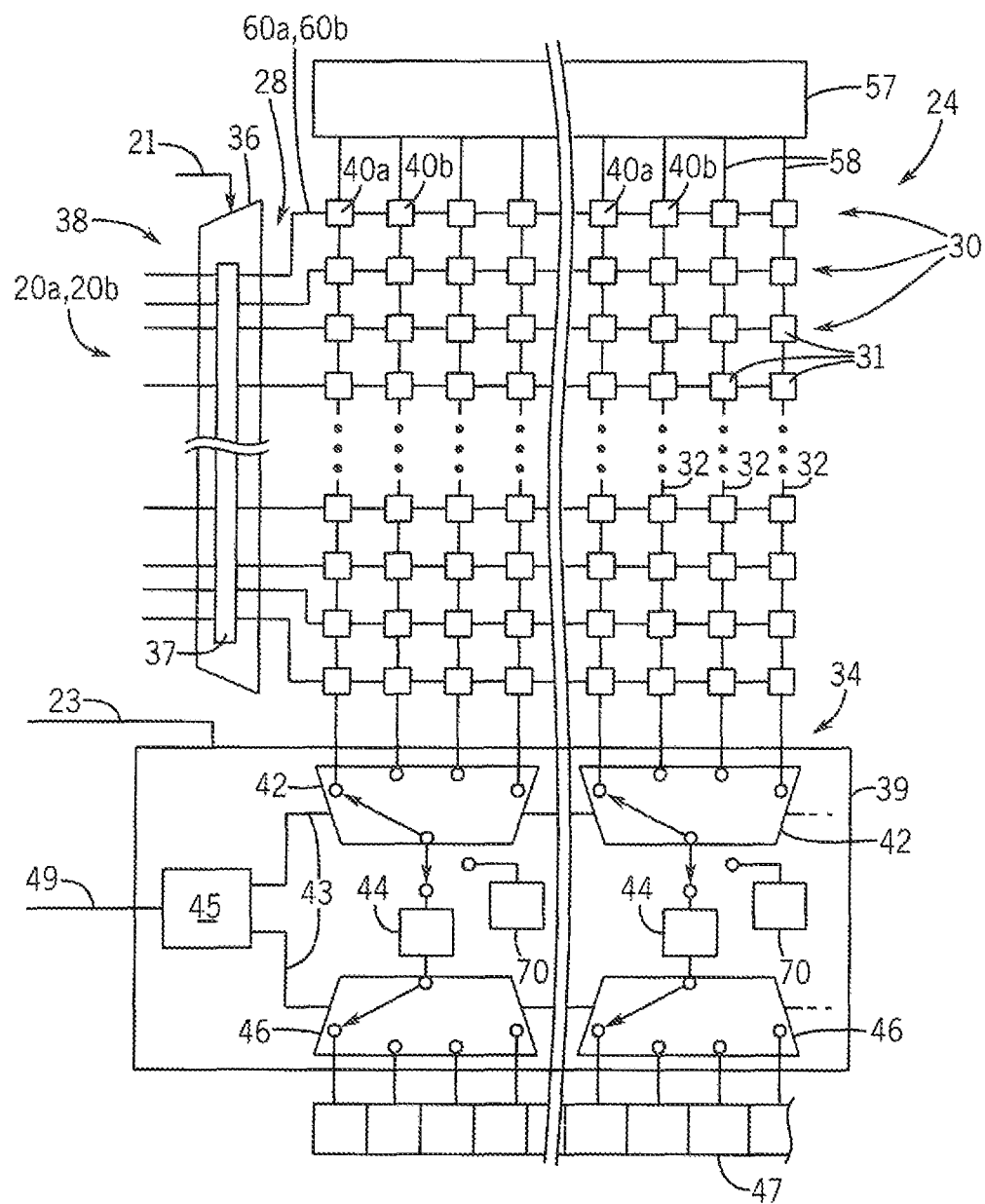
FIG. 3 is an expanded fragmentary view of the sense amplifier multiplexing circuit of FIG. 2.

Referring now to FIG. 3, the output signals 34 for each of the columns 32 may be collected in multiple column groupings 40. In this simplified example showing groupings that include four columns 32, the first grouping 40a may be columns 1, 5, 9, etc., and the second grouping 40b may be columns 2, 6, 10, etc., and so forth. One column 32 of each of the different groupings 40 will be received by a different multiplexer 42. Thus, in this example, the first multiplexer 42 will receive a first column from each grouping 40a, 40b, etc., and a second multiplexer 42 will receive a second column from each grouping 40a, 40b, etc. Each multiplexer 42 provides an electronically controllable switch that may select any of the columns received by that multiplexer 42 from an input of an associated sense amplifier 44. In this way the set of multiplexers 42 may select a single grouping 40 to be received by the set of sense amplifiers 44 and may change that selection to cycle through each of the groupings 40.

The multiplexers 42 allow the sense amplifier 44 to be shared among the groupings 40 reducing the number of sense amplifiers necessary to decode the output signals 34. As is generally understood in the art, each sense amplifier 44 distinguishes a range of voltage levels from each column of output signals 34 into two distinct states of a binary one or binary zero and in this respect may incorporate an amplifier and a comparator or similar circuitry.

By sharing the sense amplifiers 44 among multiple columns, the total number of sense amplifiers 44 is reduced according to the fraction of the number of column groupings 40 divided by the total number of columns. In conventional TCAMs, the sense amplifiers 44 and their associated circuitry can occupy an area exceeding that occupied by the memory array 24 while this multiplexing approach can reduce the area occupied by the sense amplifiers 44 and their associated circuitry to less than the area occupied by the memory array 24.

The state of each multiplexer 42, that is, which input of the multiplexer 42 is connected to the multiplexer output, is controlled by a switch signal 43 provided in parallel to each of the multiplexers 42. In this way, the operation of the multiplexers 42 can be synchronized so that they switch sequentially through their input columns 32 to provide, in sequence, the output signals 34 of the switched input column to the sense amplifier 44 for each of the groupings 40. The switching process is controlled by a sequencer circuit 45 which connects the columns of each grouping 40 in a round-robin fashion to the sense amplifiers 44 in the regular cycle.

The sequencer circuit 45 provides the same switch signal 43 in parallel to a set of demultiplexers 46 being the mirror images of the multiplexers 42 and operating in the reverse manner as the multiplexers 42 take the output from each sense amplifier 44 and sequentially switch that output, according to switch signal 43 from the sequencer circuit 45, among multiple demultiplexer outputs equal in number to the number of inputs of the multiplexers 42. Each of the outputs from each demultiplexer 46 is received by a different storage bit of the accumulator 47 so that over the course of one cycle of the switch signal 43, the accumulator 47 collects all of the output signals 34 of the memory array 24, as interpreted by the sense amplifiers 44, in column order.

Thus the parallel presentation of output signals 34 from the memory array 24 in column order is processed partially in parallel and partially in a sequential manner in its path to the accumulator 47. This partial "sequential processing" undercuts the speed gain of the parallel searching possible with the memory array 24 but greatly reduces the integrated circuit area dedicated to sense amplifiers 44. As will be discussed, the amount of sequential processing determined by the groupings 40 is adjusted so that the speed of the associative memory 22 in performing a search closely matches the normal data transfer speed of the memory bus 16 and thus is largely invisible to the processor unit 12.

Figure 4:
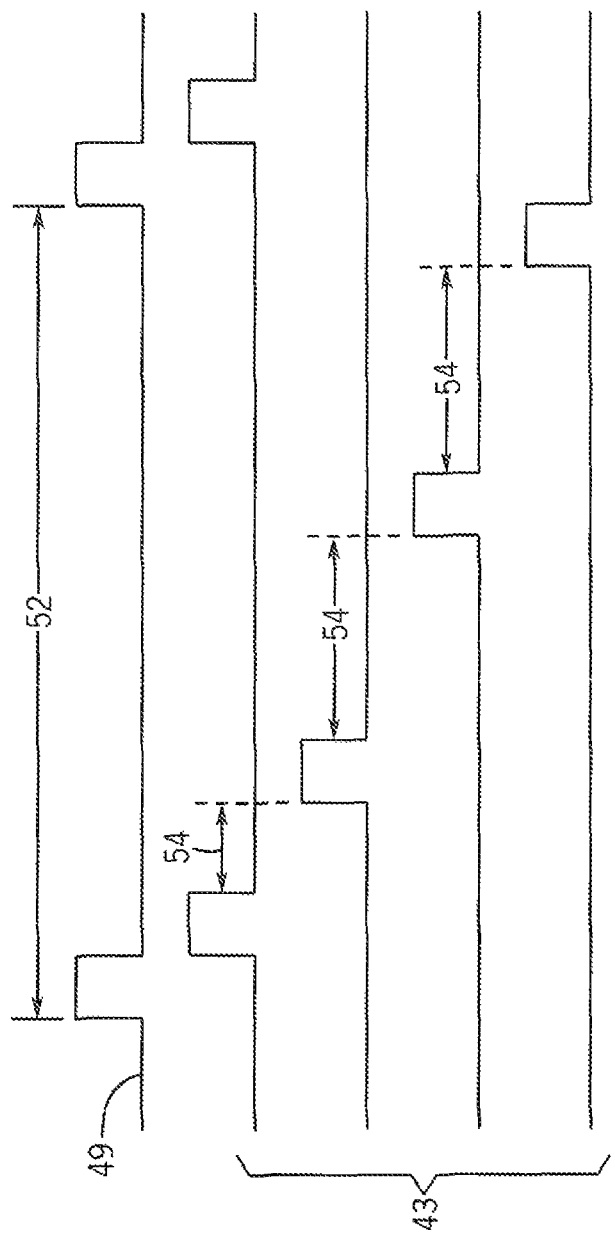
FIG. 4 is a timing diagram showing a synchronization of the multiplexing of sense amplifiers using the sense amplifier multiplexing circuit with DRAM bus timing signals.

Referring now also to FIG. 4, the sequencer circuit 45 which, for example, may be a binary modulo N counter (where N is the number of groupings 40) driven by a clock signal, may receive a synchronization signal 49 from the control lines 20c of the memory bus indicating a timing of data transfer over the memory bus 16. The synchronization signal 49 may be used to synchronize the clock signal driving the counter of the sequencer circuit 45, for example, using a phase lock loop multiplier circuit.

The present invention is intended to work with a variety of designs of memory buses 16 and in particular for those used for current dynamic random access memory, all of which provide an effective synchronization signal 49 synchronizing the transfer of data between the memory bus 16 and associated RAM 18. This synchronization signal 49, when used with the associative memory 22, for example, may define a period 52 after an input word 38 has been delivered to the associative memory 22 during which the memory bus 16 is ready to receive the data of the output signals 34. The sequencer circuit 45 may divide this period 52 into a set of sub periods 54 determined by the number of column groupings 40 and may operate to switch the demultiplexers 46 and multiplexers 42 at intervals defined by those sub periods 54. In this way, the accumulator 47 will be fully filled with all of the output derived from the output signals 34 within the period 52. At the end of the period 52, data in the accumulator 47 is transferred on the memory bus 16 and a new input word 38 may be received and this process repeated.

Figure 5:
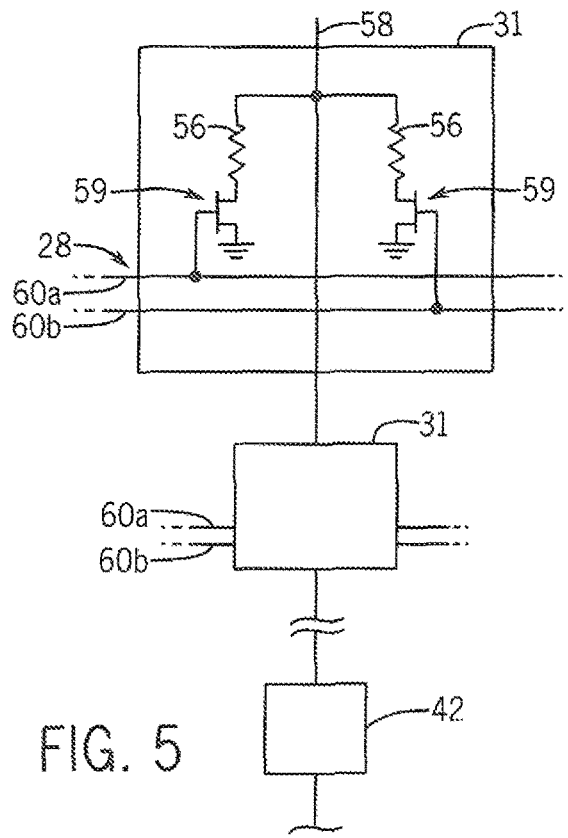
FIG. 5 is a fragmentary view of a three terminal memory cell of the associative memory constructed of resistive memory and showing its simplified memory structure that is greatly leveraged by the present inventions resulting in extremely high memory density.

Referring now to FIG. 5, the present invention may employ memory cells 31 using resistive memory which provides extremely compact memory cells 31 greatly increasing the leverage, in terms of density, that is obtained by the present invention's limiting of the number of sense amplifiers 44. In a typical three terminal resistive design of a type providing at least three states of storage for each memory cell 31, two writable resistive elements 56 are provided that may be written to, placing them in either a high or low resistance state. Specifically, each of the resistive elements 56 may attach to a column conductor 58 shared among all the memory cells 31 in that column. The remaining ends of the resistive elements 56 are separately attached through corresponding gating transistor 59 to one of the two complementary row conductors 60a and 60b having opposite Boolean states. When a given gating transistor 59 is activated, the resistance of one of the resistive elements 56 can be measured by interrogating the voltage on the column conductor 58 which implicitly has a high impedance source.

Figure 6:
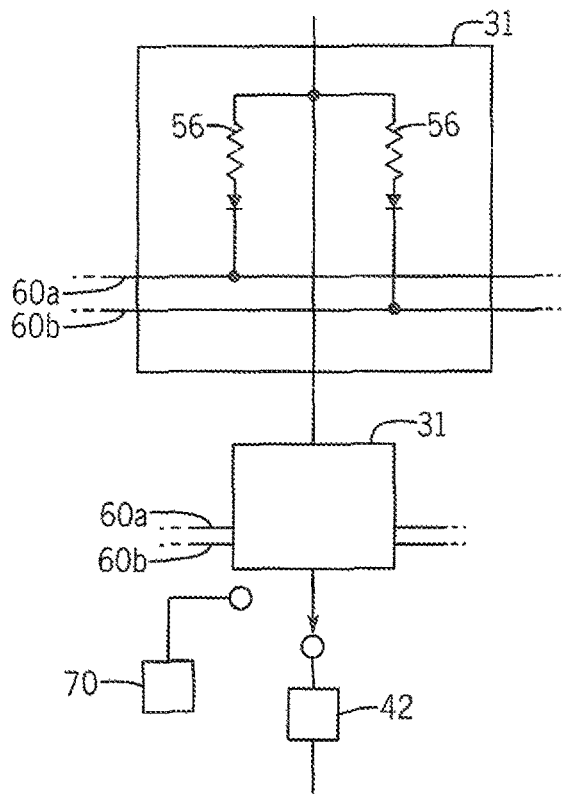
FIG. 6 is a figure similar to that of FIG. 5 showing a two terminal implementation of the memory cell.

Alternatively, and referring to FIG. 6, in a typical two terminal resistive design the two writable resistive elements 56 may each attach to a column conductor 58 shared among all the memory cells 31 in that column and remaining ends of the resistive elements 56 may be separately attached through corresponding gating diodes 61 to one of the two complementary row conductors 60a and 60b having opposite Boolean states. When a given gating diode 61 is conducting (by pulling the corresponding conductor 60a or 60b low), the resistance of one of the resistive elements 56 can be measured by interrogating the voltage on the column conductor 58 which implicitly has a high impedance source.

In either case, in the content addressable mode, during the search, a readout voltage may be applied by column power supply circuit 57 to each column conductor 58 which may then be monitored by a sense amplifier 44 (when connected by multiplexer 42) to determine the state of the resistive elements 56 as selectively activated by the complementary row conductors 60a and 60b. The function of this column power supply circuit 57 may alternatively be incorporated into the sense amplifier bank. It will be appreciated that the resistive states of the two resistive elements 56 of each memory cell 31 may store four states which may be used to encode a logical one, logical zero, or don't care state. As discussed briefly above, the unused state possible with two binary elements may be utilized in some embodiments to obtain even higher memory density by collecting unused states among several memory cells 31 to provide a new virtual memory cell.

The logical column conductors 58 each provide a "logical or" of each of the memory cells 31 in the respective column 32 and the sense of the logic of each memory cell 31 may be adjusted so that the state of the column conductors 58, as modified by each memory cell 31, indicates whether the data stored in every memory cell 31 of the column matches the corresponding row of the input pattern 28 applied through the complementary row conductors 60a and 60b.

Thus, for example, the following states may be encoded in the resistance values of the left and right resistive elements 56 shown in FIG. 5 where R indicates a high resistance value and r indicates a low resistance value.

TABLE I

| State | Left resistance value | Right resistance value |
|---|---|---|
| Logical 0 | R | r |
| Logical 1 | r | R |
| Don't care | R | R |

It will be appreciated that a relatively low current will flow from the column conductors 58 to the resistive elements 56 when there is a match between the input pattern 28 for that row and the stored value in the memory cell 31 or if the stored pattern is a don't care pattern, and a relatively high current value will pass from the column conductors 58 through the resistive elements 56 when there is not a match between the input pattern 28 for that row and the stored value in memory cell 31. Thus any mismatch at any memory cell 31 of the column will pull the column conductor 58 low indicating no match for that entire column.

Figure 7:
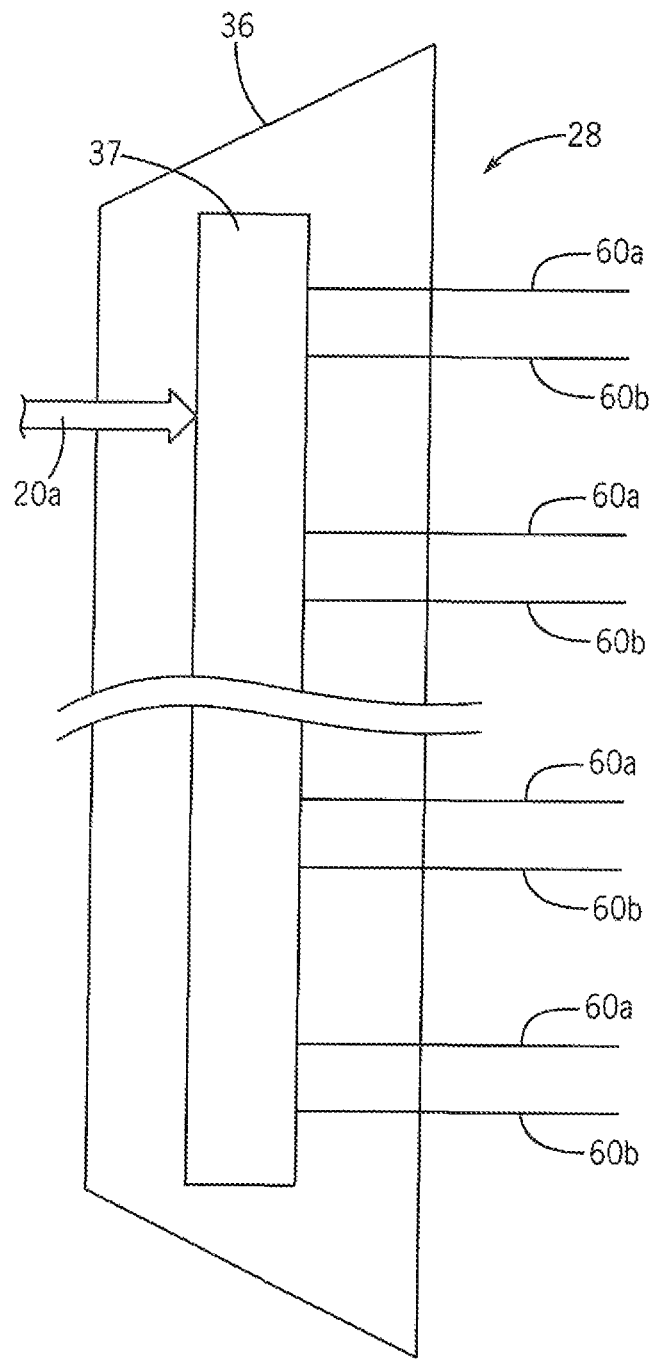
FIG. 7 is an expanded view of a row decoder for providing selectable content addressable memory and random-access memory operation.

Referring now to FIGS. 3 and 7, the memory array 24 may operate in two distinct modes: (1) content addressable mode discussed above, (2) a random access mode.

During the content addressable mode, the column power supply circuit 57 provides a readout voltage to each of the column conductors 58 simultaneously. This allows the simultaneous generation of output signals 34 when an input pattern 28 is applied to the rows through complementary row conductors 60a and 60b. More specifically, the row decoder 36 receives the input pattern 28 and processes that data in a pass-through mode. In the pass-through mode, the input pattern 28 for each row is inverted and applied to row conductor 60a for that row and applied in a non-inverted form to row conductor 60b. Signals of the input pattern 28 are decoded by input decoder 37 from the input word 38 which, as noted above, may simply pass through the input word 38 as the input pattern 28 over data lines 20a or may decode the input word 38 for the purpose of "two-bit" encoding. Both of these techniques which provide multi-bit mapping will be termed herein "pass-through".

In contrast, during a random access mode, only the row conductors 60a and 60b for a single row are activated meaning that, for that single row only, the input pattern 28 of that row is inverted and applied to row conductor 60a applied in a non-inverted form to row conductor 60b. The row conductors 60a and 60b for the remaining rows 30 are placed in a deactivated, high state. The particular row 30 activated during the programming mode will be determined by the numeric value represented by a binary interpretation of the input pattern 38 (in this case address data 20b) where a value of zero, for example, resolves to the first row 30, a value of one resolves to the second row 30, etc. This decoding system is typical for random access address decoding A.

When the random access operation being performed is a random access read of the memory 22, the output signals 34 on each column conductor 58 from the column power supply circuit 57 are processed by the multiplexers 42 and sense amplifiers 44 allowing a data word (now stored in a row rather than column) to be simultaneously read out for one row. The multiplexers 42 in the demultiplexers 46 may be scanned as previously described to assemble the output word in accumulator 47.

When the random access operation being performed is a random access writing of the memory 22, a write control signal 23 (being part of the normal memory control signal structure) is received by the sense amplifier bank 39 and switches the output of the multiplexers 42 from the sense amplifiers 44 to a write pulse circuit 70. The write pulse circuit 70 may apply desired programming electrical pulses to a single memory cell 31 (dictated by the selected row and column per row decoder 36 and multiplexers 42) to program the resistors 56 (shown in FIGS. 5 and 6) to the several states described above as is understood in the art. It will be appreciated that the multiplexers operate as electrical switches communicating analog power signals and not simply digital data.

It will be appreciated that the associative memory 22 may thus be dynamically reconfigured as either random-access memory or content addressable memory, a proposition made practical by the ability to obtain meaningfully high memory densities comparable to random access memories provided by the present invention.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

Logical rows and columns are intended to be a construction for clarity of description and should not be understood as requiring actual columns or rows of conductors or elements.

It is specifically intended that the present invention not be limited to the embodiments and illustrations contained herein and the claims should be understood to include modified forms of those embodiments including portions of the embodiments and combinations of elements of different embodiments as come within the scope of the following claims. All of the publications described herein, including patents and non-patent publications, are hereby incorporated herein by reference in their entireties.

I claim:

1. An associative memory comprising:
    a set of memory cells arranged in logical rows and columns adapted to receive an input pattern in parallel along the rows and to provide an output indication along each column reflecting whether stored values of memory cells of each column match the input pattern;
    an input decoder applying an input pattern applied simultaneously to the logical rows of the set of memory cells;
    a set of multiplexers receiving at multiplexer inputs, outputs from multiple columns of the set of memory cells and also receiving a selector input controlling a connection of one of the multiplexer inputs to a multiplexer output; and
    sense amplifiers communicating with each of the multiplexer outputs for interpreting the multiplexer outputs as logical values at the sense amplifier outputs;
    further including a sequencer providing a selector input to each multiplexer operating to connect the multiplexer inputs successively to the multiplexer output in a cycle while a given input pattern is being applied to the rows.

2. The associative memory of claim 1 further including a bus timing signal input receiving a periodic timing signal from a memory bus communicating with the associative memory, the timing signal providing a timing of transfer of data on the memory bus to the associative memory; and
    wherein the sequencer operates synchronously with the bus timing signal to complete a cycle of connecting the sequence of multiplexer inputs successively with the multiplexer output within a period of the timing signal.

3. The associative memory of claim 2 wherein a time duration of the cycle is substantially equal to the period of the timing signal.

4. The associative memory of claim 2 wherein the timing signal indicates a shortest period between successive transfers of data between the associative memory and the memory bus.

5. The associative memory of claim 1 further including an accumulator communicating with the sense amplifier outputs to receive logical values at different selector inputs at different accumulator storage elements to construct a data word representing the output of each column.

6. The associative memory of claim 1 wherein the output of each column is a logical combination of matchings at each given memory cell of the column between a portion of the input pattern received by the given memory cell and a value stored in the given memory cell.

7. The associative memory of claim 1 wherein each memory cell may store any of: a logical one value, or a logical zero value, or a logical don't care value and wherein the stored value is indicated to match a corresponding portion of the input pattern in the cases of:
    (i) the stored value being a logical one value and the corresponding portion of the input pattern being a logical one value; and
    (ii) the stored value being a logical zero value and the corresponding portion of the input pattern being a logical zero value; and
    (iii) the stored value being a logical don't care value and the corresponding portion of the input pattern being either a logical zero value or a logical one value.

8. The associative memory of claim 1 wherein the memory cells employ a resistance element having a resistive value storing data.

9. An associative memory comprising:
    a set of memory cells arranged in logical rows and columns adapted to receive an input pattern in parallel along the rows and to provide an output indication along each column reflecting whether stored values of memory cells of each column match the input pattern;
    an input decoder applying an input pattern applied simultaneously to the logical rows of the set of memory cells;
    a set of multiplexers receiving at multiplexer inputs, outputs from multiple columns of the set of memory cells and also receiving a selector input controlling a connection of one of the multiplexer inputs to a multiplexer output; and
    sense amplifiers communicating with each of the multiplexer outputs for interpreting the multiplexer outputs as logical values at the sense amplifier outputs;
    wherein the input decoder receives a search word and decodes the search word to the input pattern different from the search word according to a predetermined function.

10. The associative memory of claim 1 wherein the input decoder operates in a first pass-through mode to apply the data simultaneously to the logical rows of the set of memory cells and in a second address decoder mode to select a single of the logical rows of the set of memory cells for access;
    whereby the associative memory can operate as a random access memory in the second address decoder mode.

11. The associative memory of claim 10 wherein the associative memory with the input decoder operating in the second address decoder mode may either write or read the data of the selected single row.

12. The associative memory of claim 11 wherein each memory cell stores a logical one or a logical zero value matching a portion of the input pattern on an associated row if that portion is identical to the stored value; and
    wherein each memory cell stores a logical don't care value matching a portion of the input pattern on an associated row.

13. The associative memory of claim 11 wherein the memory cells employ a resistance element having a resistive value storing data programmable by the programming voltage to change a resistance value.

14. A computer system comprising:
    an electronic processor for executing arithmetic and logical instructions on data;
    an electronic memory system including random access memory receiving memory addresses to provide access to data stored at the addresses and content addressable memory receiving search words to provide data indicating whether the search words match data stored in the content addressable memory;

a unified memory bus communicating between the random access memory and the content addressable memory to provide memory addresses to the random access memory and search words to the content addressable memory and to receive data in response;

wherein content addressable memory includes:

a set of memory cells arranged in logical rows and columns adapted to receive an input pattern in parallel along the rows and to provide an output indication along each column reflecting whether stored values of memory cells of each column match the input pattern;

an input decoder applying an input pattern applied simultaneously to the logical rows of the set of memory cells;

a set of multiplexers receiving at multiplexer inputs, outputs from multiple columns of the set of memory cells and also receiving a selector input controlling a connection of one of the multiplexer inputs to a multiplexer output; and sense amplifiers communicating with each of the multiplexer outputs for interpreting the multiplexer outputs as logical values at the sense amplifier outputs;

further wherein the random-access memory is dynamic random access memory and the memory bus provides data and control lines for communicating with dynamic random access memory and wherein the content addressable memory is compatible with the data and control signals of the memory bus.

15. The electronic computer system of claim 14 further including a sequencer providing a selector input to each multiplexer operating to connect the multiplexer inputs successively to the multiplexer outputs in a cycle while a given input pattern is being applied to the rows.

16. The electronic computer system of claim 14 further including a bus timing signal input receiving a periodic timing signal from the memory bus communicating with the associative memory, the timing signal providing a timing of transfer of data on the memory bus to the associative memory; and wherein the sequencer operates synchronously with the bus timing signal to complete a cycle of connecting the sequence of multiplexer inputs successively with the multiplexer output within a period of the timing signal.

* * * * *